(12) United States Patent
Maurino et al.

(10) Patent No.: US 12,738,946 B2
(45) Date of Patent: Sep. 15, 2026

(54) SYNCHRONIZATION CIRCUIT AND METHOD

(71) Applicant: Analog Devices International Unlimited Company, Limerick (IE)

(72) Inventors: Roberto S. Maurino, Turin (IT); Mayur Gurunath Anvekar, Bangalore (IN); Naiqian Ren, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 111 days.

(21) Appl. No.: 18/597,655

(22) Filed: Mar. 6, 2024

(65) Prior Publication Data

US 2024/0313791 A1 Sep. 19, 2024

(30) Foreign Application Priority Data

Mar. 13, 2023 (IN) ............................. 202341016527

(51) Int. Cl.
*H03M 3/00* (2006.01)
*H03L 7/081* (2006.01)
*H03L 7/091* (2006.01)

(52) U.S. Cl.
CPC ............ *H03L 7/091* (2013.01); *H03L 7/0818* (2013.01); *H03M 3/496* (2013.01)

(58) Field of Classification Search
CPC ....... H03L 7/091; H03L 7/0818; H03M 3/496
See application file for complete search history.

(56) References Cited

U.S. PATENT DOCUMENTS 9,893,877 B2 2/2018 Anvekar et al.
11,211,942 B2 12/2021 Lamb et al.
2011/0285433 A1* 11/2011 Hezar .................. H03M 3/372 327/156
2020/0073334 A1* 3/2020 Fan ...................... G04F 10/005

* cited by examiner

*Primary Examiner* — Janice N Tieu
(74) *Attorney, Agent, or Firm* — Schwegman Lundberg & Woessner, P.A.

(57) ABSTRACT

This disclosure relates to providing an improved synchronization circuit for a sampling device. In particular, it relates to providing a time-to-digital converter for improving the accuracy of a synchronization circuit for a data sampling device.

20 Claims, 8 Drawing Sheets

SYNCHRONIZATION CIRCUIT AND METHOD

FIELD OF DISCLOSURE

This disclosure relates to providing an improved synchronization circuit for a data sampling device. In particular, it relates to providing a time-to-digital converter for improving the accuracy of a synchronization circuit for a data sampling device.

BACKGROUND

Some applications require sampling of related analog signals by multiple devices. Typically, the sampling must be synchronized between the devices for the data output by the devices to be useful. For example, in sonar applications, sound waves transmitted or received may be sampled by multiple devices. For calculation of time-of-flight information from the sampled signals to be accurate, the sampling must be synchronized. Many sampling applications also require the ability to set a specific output sample rate of the sampled signal, which may be different from and/or asynchronous with a clock frequency used to sample.

Problems can arise, however, when attempting to synchronize sampling at multiple devices and set specific output sample rates at these devices. Attempting to synchronize provision of a sampling clock signal to each of the devices can incur significant board design overhead, as the clock signal routing to each device must be carefully matched. Using one device as a master and providing its clock to other devices can similarly require careful clock signal routing to each of the other devices as well as compensation of the sampling edges between the master and slave devices.

U.S. Pat. No. 9,893,877 B2 discloses an example technique for synchronization between multiple sampling devices using a single pin interface at each sampling device to control an output data rate. Each sampling device may have respective clock signal which may be out-of-phase compared to a clock signal on another sampling device. In order to enable synchronization between the multiple sampling devices and ensure that the sampled output is provided at a desired output data rate, a desired output data rate ODR signal is applied at a single pin on each sampling device. The frequency or rate of this ODR signal can be determined using the sampling device and can be used to accomplish the required output data rate. While this configuration helps to improve synchronization between the sampling devices, there may still be a delay between the applied ODR signal and the clock signal CLK applied to a sampling device, resulting in reduced accuracy of the sampling device. Therefore, there is a need to provide a sampling device with improved accuracy to in turn enable improved synchronization between multiple sampling devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As mentioned above, problems can arise when attempting to synchronize sampling at multiple devices and set specific output sample rates at these devices. Attempting to synchronize provision of a sampling clock signal to each of the devices can incur significant board design overhead, as the clock signal routing to each device must be carefully matched. U.S. Pat. No. 9,893,877B2, the contents of which are hereby incorporated by reference, describes techniques for synchronization between multiple sampling circuits using a single pin interface to control an output data rate. While this configuration helps to improve synchronization between the sampling devices, there may still be a delay between the applied ODR signal and the clock signal CLK applied to a sampling device resulting in reduced accuracy of the sampling device.

This disclosure provides an improved synchronization circuit for the said sampling device to improve the accuracy of the sampling device. In particular, this disclosure relates to providing a time-to-digital converter (TDC) for improving the accuracy of a synchronization circuit for a data sampling device.

Figure 1:
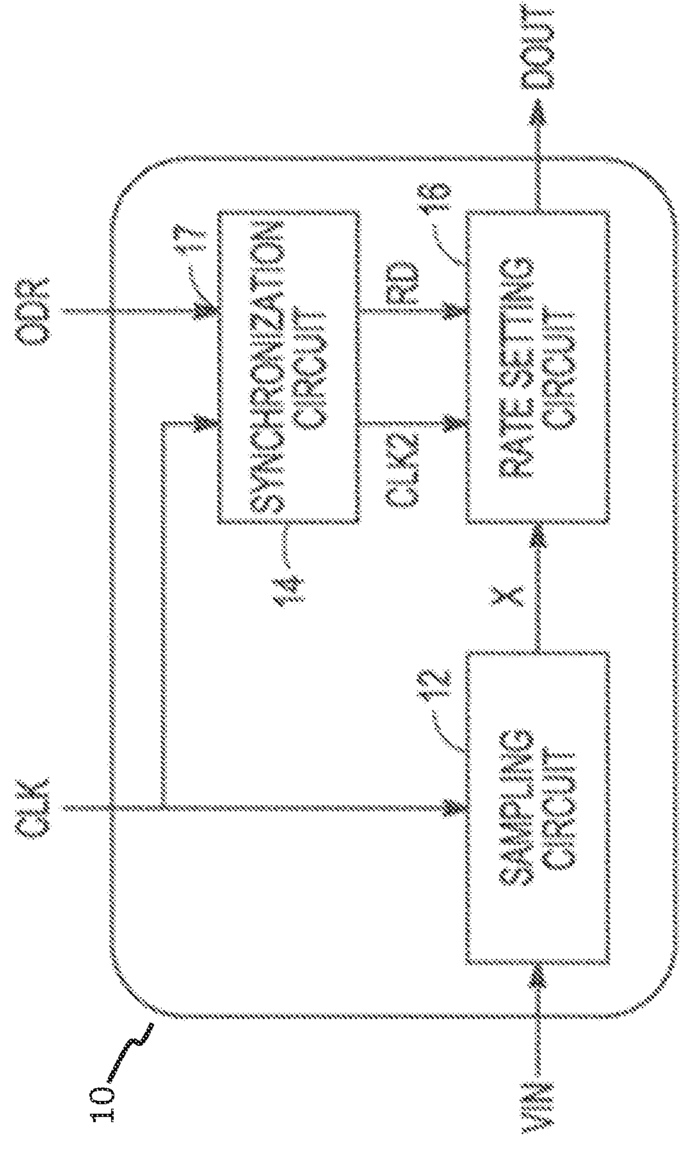
FIG. 1 is an example implementation of a sampling device to provide synchronization of sampling and sample rate setting.

FIG. 1 depicts an example of a sampling device 10 to provide synchronization of sampling and sample rate setting. The sampling device 10 may include a sampling circuit 12, a synchronization circuit 14, and a rate setting circuit 16.

The sampling circuit 12 is configured to receive an analog input signal VIN and a first clock signal CLK, and output a sampled signal X based on the analog input signal VIN at a rate based on a frequency of the first clock signal CLK. In some embodiments, the input signal VIN may be sampled with a divided-down version of the clock signal CLK—for example a divided-by-2 CLK signal.

The sampling circuit 12 may be a circuit that performs sampling as part of analog-to-digital conversion, data modulation, etc. For example, the sampling circuit 12 may be an analog-to-digital converter (ADC) that receives the analog input signal VIN, and samples and converts the analog input signal to a corresponding digital signal DOUT at a certain sample rate as the sampled signal. In another embodiment, the sampling circuit 12 may be a modulator circuit, such as a sigma delta modulator, that receives the analog input signal VIN, and samples and modulates the analog input signal to generate a corresponding modulated signal at a certain modulation rate as the sampled signal.

The synchronization circuit 14 comprises a terminal 17 for receiving a desired output data rate signal ODR representing a desired output data rate (ODR) for the signal DOUT in FIG. 1. That is, the frequency or rate of the signal ODR received on the terminal 17 can be used to determine the required output data rate.

As seen in FIG. 1, the synchronization circuit 14 is configured to receive the first clock signal CLK and the signal ODR. The synchronization logic in the synchronization circuit 14 then processes the received signals to output a second clock signal CLK 2 synchronized to the signal ODR representing the desired output data rate and a data signal RD indicative of the relationship between the signal ODR and the first clock signal CLK. For example, in some embodiments, the data signal RD can be indicative of the ratio of a frequency of the signal ODR to the first clock signal CLK.

In some examples, the frequency of the first clock signal CLK is higher than a frequency of the second clock signal CLK 2 and a frequency of the signal ODR.

The rate setting circuit 16 is configured to receive the sampled signal X, the second clock signal CLK 2, and the data signal RD representing a relationship between the signal ODR to the first clock signal CLK and provide a digital output DOUT at the desired output data rate, where the desired output rate is determined based on the signal ODR.

The synchronization circuit 14, as described above, typically operates at the rate of the first clock signal CLK. As a result, the signal ODR, received at terminal 17, is typically resampled by the synchronization circuit 14 at the rate of the first clock signal CLK. The inventors of the present invention have realised that resampling of the ODR signal at the rate of the first clock signal CLK can introduce a phase error which may be as large as one period of the first clock signal CLK.

Figure 2:
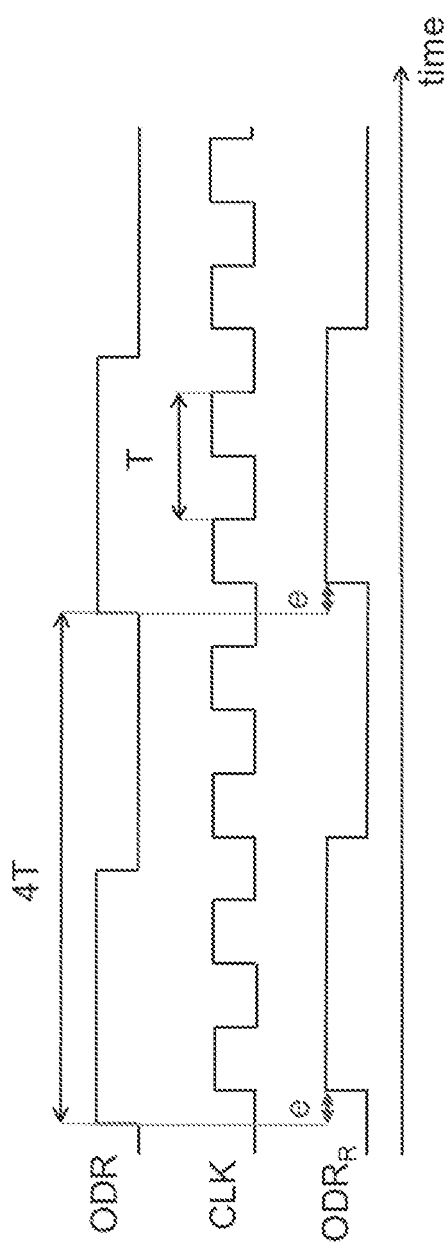
FIG. 2 is an example timing diagram showing a phase error being introduced due to resampling of the ODR signal at the rate of the clock signal CLK

FIG. 2 shows an example timing diagram which shows a phase error being introduced due to resampling of the ODR signal at the rate of the clock signal CLK. In FIG. 2, the period of the ODR signal is an integer multiple of the period of the clock signal CLK—that is, given a period of T for the CLK signal, the period of the ODR signal is 4T. As seen in FIG. 2, when the ODR signal is resampled on the rising edge of CLK by the synchronization circuit 14, the synchronization logic effectively operates on the signal $ODR_R$ which is the resampled version of the ODR signal. As the first clock signal CLK and the signal ODR are asynchronous, there is a delay or a phase error e, between the signal ODR received at terminal 17 and its resampled version $ODR_R$ upon which the synchronization logic operates. The skilled person will understand that, for a signal at frequency Fin, phase error and time error are related by the following relationship: Phase error (in radians)=2*pi*Fin*time error. The skilled person will understand that phase error can be measured in radians, degrees or units of time. Therefore, the terms phase error and time error will be used interchangeably in this specification.

In other examples, a rising edge of ODR could occur very close to the rising edge of the first clock signal CLK, or a full period T earlier, and still generate the same resampled $ODR_R$ signal. Thus, the resampling of the ODR signal based on the first clock signal CLK can introduce a phase uncertainty of up to almost a full period of CLK. As seen in the example of FIG. 2, in the case where the period of ODR is an integer multiple of the period T of CLK, the error e is constant. In fact, the inventors have realised that a non-zero average of the timing error e can occur in any scenario when a ratio of the period of the ODR signal to a period of the first CLK signal is an integer ratio. Typically, the synchronization circuit 14 includes low pass filtering operation to filter out the error e. However, the inventors have realised that in practical implementations of the circuit 14, this filtering operation can be ineffective on the average component of timing error e. The resultant timing error e will also propagate to the rate setting circuit as the synchronization circuit outputs the second clock signal CLK 2 and the data signal RD to the rate setting circuit.

One conventional method to address the above problem would be to use a faster first clock signal CLK. However, the inventors have proposed a more power efficient method to address the above-mentioned problem.

Figure 3A:
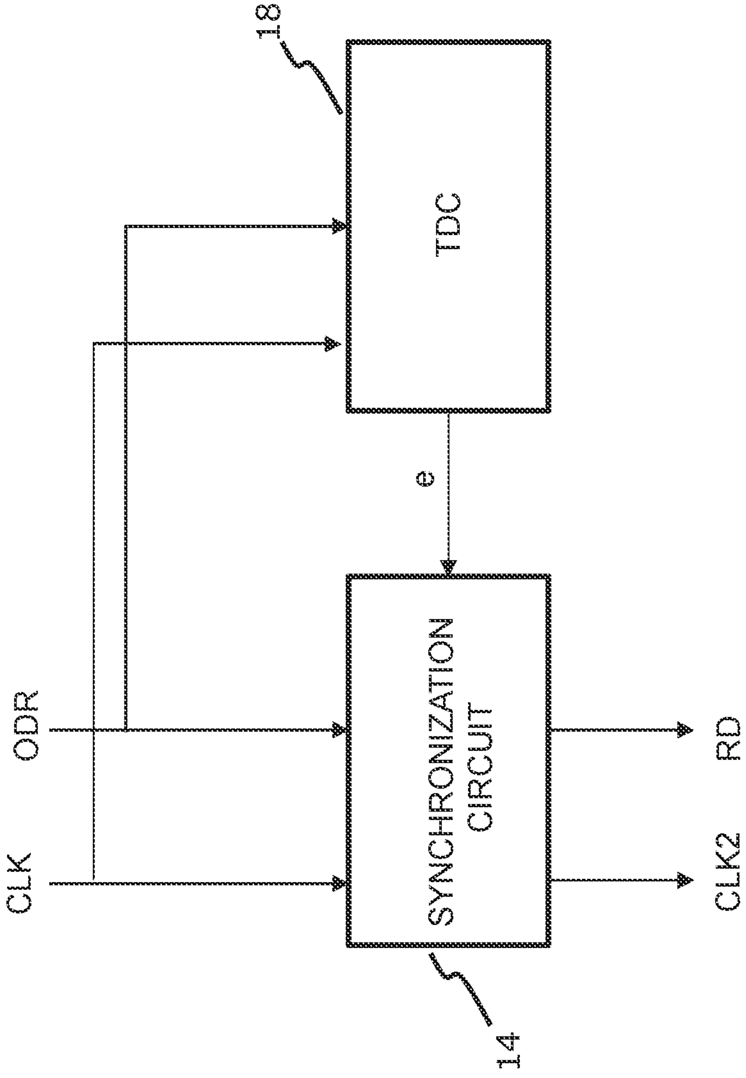
FIG. 3A shows a circuit comprising a synchronization circuit coupled to a time-to-digital converter (TDC) according to an embodiment of this disclosure.

The inventors have proposed to introduce a means to measure the timing error e between the ODR signal and the first clock signal CLK. The measured timing error e can then be fed back to the synchronization logic to enable the synchronization logic to account for the timing error e when processing the ODR signal and the first clock signal CLK to provide the second clock signal CLK2 and data signal RD. In particular, as seen in FIG. 3A, the inventors have proposed to implement a time-to-digital converter (TDC) 18 to directly measure the timing error e. In FIG. 3A, the TDC 18 receives the first clock signal CLK and ODR signal as inputs, measures the timing error e and provides this measurement as input to the synchronization circuit 14.

In another embodiment, an offset can be added to the measured timing error e, before providing the measured timing error e to the synchronization logic. The addition of an offset to the measured timing error also allows for a fixed fractional delay to be applied to the synchronization circuit 14, in some embodiments. In this way, for a sampling system comprising a plurality of sampling devices 10, the present invention advantageously enables the phase delay of each sampling device 10 to be adjusted by the application of a respective offset for each sampling device. Additionally, the invention enables a fractional time delay to be applied without the need of complex circuitry.

The inventors have realised that implementing a TDC 18 enables the ODR signal to be effectively sampled at a faster clock rate, in a more power efficient manner. This is because the TDC 18 is only activated between the rising edge of the first clock signal CLK and the rising edge of ODR signal, hence saving power compared to the conventional alternative method described above of implementing a faster first clock signal CLK.

Figure 3B:
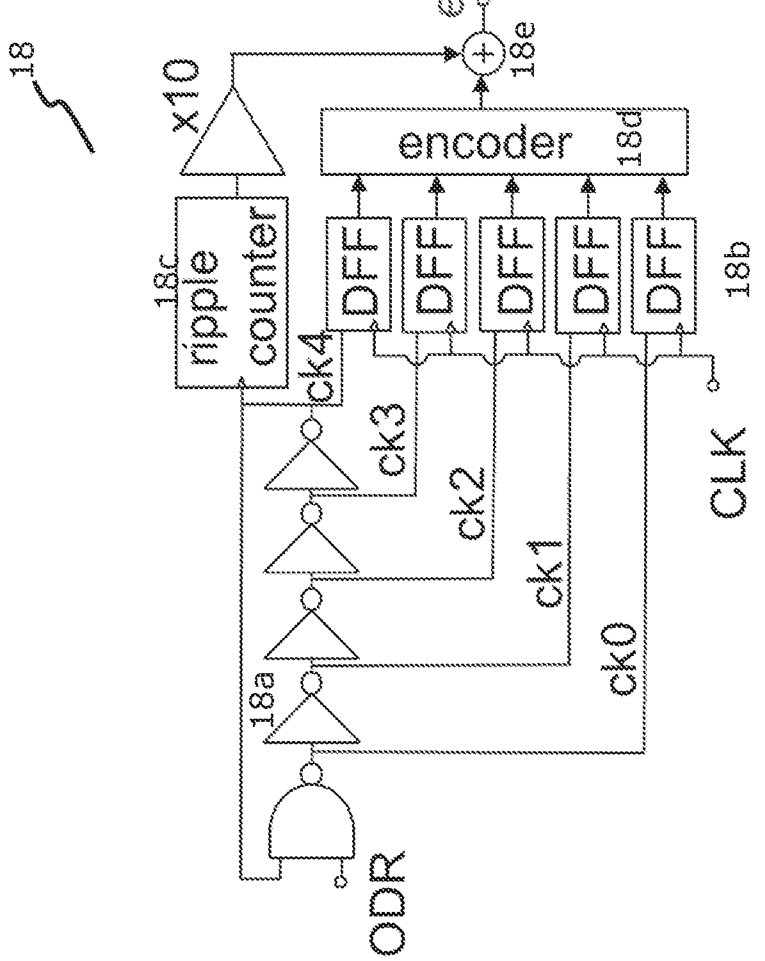
FIG. 3B shows a time-to-digital convertor (TDC) circuit according to an embodiment of this disclosure.

FIG. 3B shows an example TDC 18 according to an embodiment of this disclosure. The skilled person will understand that other implementations of a TDC are also possible and will provide the above-mentioned advantage of a power efficient method to improve the phase matching accuracy of the synchronization circuit 14.

The TDC 18 in FIG. 3B comprises a ring oscillator 18*a*, a bank of flip flops 18*b*, a counter 18*c*, an encoder 18*d* and an adder 18*e*. When the ODR signal goes high, the ring oscillator 18*a*, comprising a NAND gate and four inverters, starts oscillating. The ring oscillator 18*a* of the TDC 18 is configured to have a higher oscillation frequency than the ODR signal and the first clock signal CLK.

The TDC 18 counts the number of state transitions of the ring oscillator 18*a* between the rising edge of ODR signal and the next rising edge of first clock signal CLK and thereby measures the timing error e. This timing error e is then provided as an input to the synchronization logic in the synchronization circuit 14 in addition to the ODR signal and the first clock signal CLK inputs. As a result, the synchronization logic accounts for the timing error e and provides a more accurate second clock signal CLK2 and data signal RD.

Figure 4:
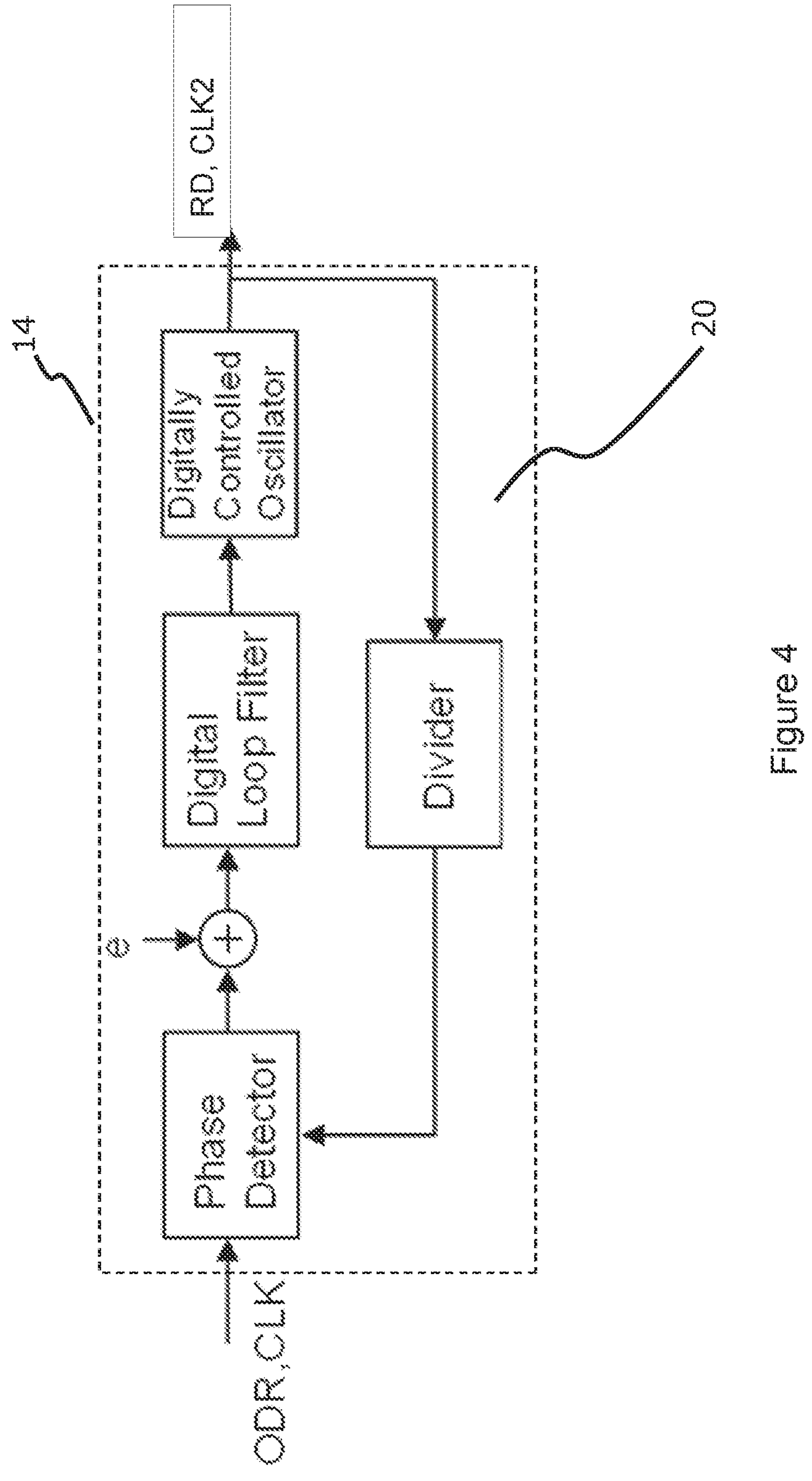
FIG. 4 shows an example implementation of the synchronization logic of the synchronization circuit, according to an embodiment of this disclosure.

FIG. 4 shows an example implementation of a synchronization logic 20 of the synchronization circuit 14 where the synchronization logic 20 is configured to receive as inputs: the timing error e provided by the TDC 18, the ODR signal and the first clock signal CLK. The synchronization logic 20 of the synchronization circuit 14 in FIG. 4 is based on a digital phase locked loop circuit (DPLL). This implementation of the synchronization logic 20 is discussed in more detail in U.S. Pat. No. 11,211,942 which is hereby incorporated by reference. Briefly, the DPLL in FIG. 4 outputs a second clock signal CLK2 synchronized to the ODR signal and a data signal RD indicative of the relationship between a frequency of the ODR signal and the frequency of the first clock signal CLK. The synchronized clock signal may thus be independent of any jitter present in the output data rate signal. Using a DPLL can provide several benefits. For example, jitter on the output data rate pin is of little or no concern to performance, thereby relaxing any constraints on board routing.

As discussed earlier, the synchronization logic 20 or DPLL in FIG. 4 operates on a resampled version of the ODR signal—that is, it operates on the ODR signal as resampled by the first clock signal CLK. This in turn results in a delay or timing error e. As the TDC 18 provides a direct measurement of the timing error e between the rising edge of the actual (not the resampled version) ODR signal and the rising edge of the first CLK signal (and hence the rising edge of the resampled ODR signal), this timing error e can be added at the output of the phase detector of the DPLL to improve the accuracy of the synchronization circuit.

As discussed above in relation to FIG. 3A, in another embodiment, an offset can be added to the measured timing error e, before providing the measured timing error to the synchronization logic 20 or in this example, the DPLL. In some embodiments, the addition of an offset to the measured timing error also allows for a fixed fractional delay to be applied to the synchronization logic 20.

The synchronization logic 20 implemented using DPLL in FIG. 4 can be further simplified such that the data signal RD is also computed using the TDC instead of using the DPLL—in this case, the DPLL is only used for providing the second clock signal CLK2. We will now describe this simplified embodiment below.

As indicated in FIG. 4, the DPLL 20 outputs a data signal RD. This data signal RD is required as an input for the rate setting circuit 16—for example, the rate setting circuit 16 can be based on a transposed polynomial decimator circuit (as described in detail in U.S. Pat. No. 11,211,942 which is incorporated by reference). In general, for any sampled input x[n], a rate setting circuit 16 would need to know a time difference between the sampled input x[n] at time tx[n] and the next output data rate edge (based on the output data rate signal ODR), at time ty[k+1].

Figure 5:
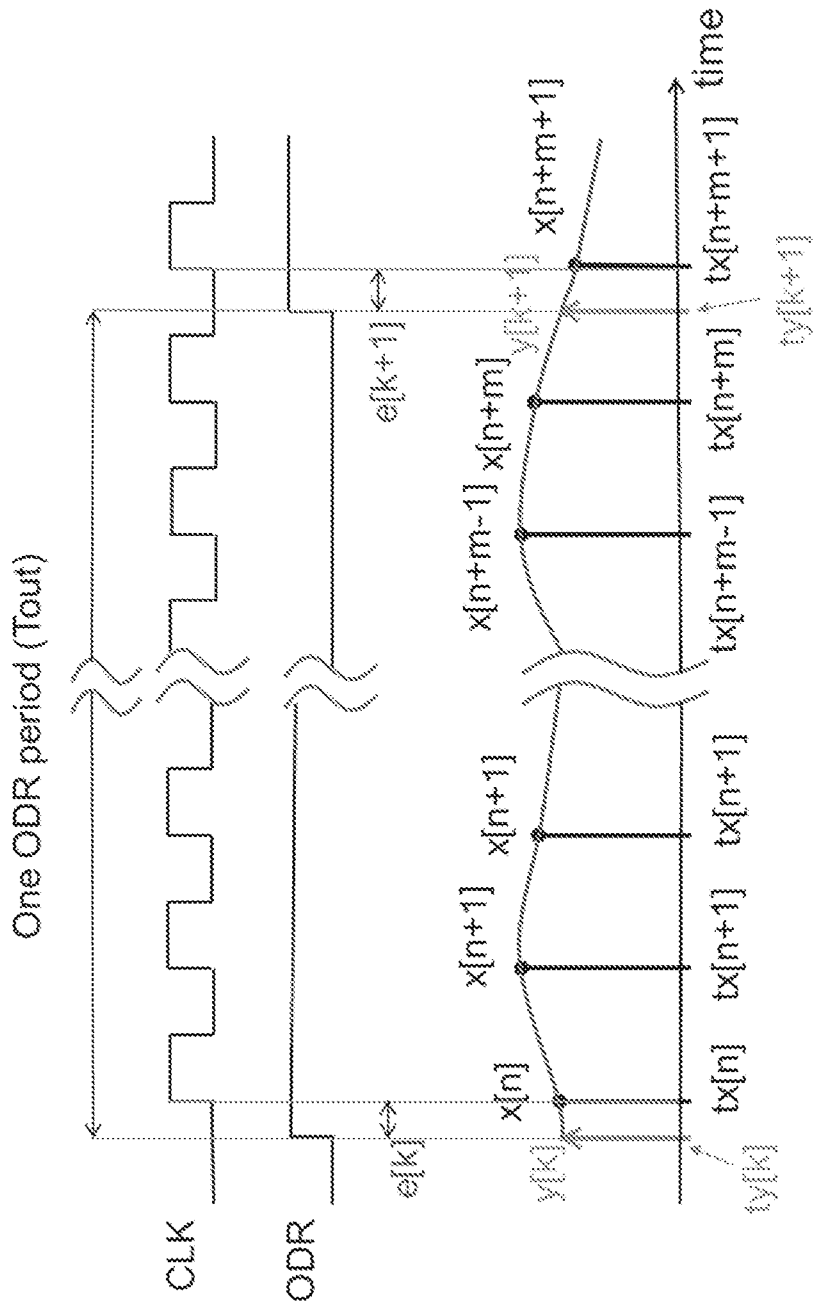
FIG. 5 shows a timing diagram of the desired output data rate signal ODR, the first clock signal CLK and the sampled input as a function of time.

The derivation of this time difference is also shown schematically in FIG. 5 which shows a timing diagram of the ODR signal, the first clock signal CLK and the sampled input signal x[n] (sampled by the sampling circuit 12). The said time difference may be normalized to the output data rate period Tout to provide the data signal RD or in this particular case, the μ parameter for the rate setting circuit. This is the definition of the μ parameter is also described in equation 1 of U.S. Pat. No. 11,211,942 and is repeated below for completeness:

$$\mu[n] = \left(n * \frac{fsout}{fsin}\right) - \text{floor}\left(n * \frac{fsout}{fsin}\right) \quad (1)$$

where fsout is the ODR frequency (fsout=1/Tout) and f sin is the frequency of the input samples, namely the inverse of the period Tin of the first clock signal CLK used to sample the input signal Vin.

In the embodiment of FIG. 4, the DPLL is used to provide both the second clock signal CLK2 and the data signal RD or μ parameter. However, the inventors have realised that the DPLL 20 of FIG. 4 can be further simplified when used in conjunction with TDC 18 in that TDC 18 can be used to not only determine a timing error e between the ODR signal and the resampled ODR signal but also the μ parameter. The derivation of the μ parameter using a TDC will now be described in detail below with reference to FIG. 5.

Use of TDC to Determine μ Parameter:

From FIG. 5, it can be seen that:

$$\mu[n] = (ty[k+1] - tx[n])/Tout = (m+1)Tin/Tout - e(k+1)/Tout = (m+1-e(k+1)/Tin) * Tin/Tout \quad (2)$$

$$\mu[n+1] = (ty[k+1] - tx[k+1])/Tout = m\ Tin/Tout - e(k+1)/Tout = (m - e(k+1)/Tin) * Tin/Tout \quad (3)$$

$$\ldots$$

$$\mu[n+m] = (ty[k+1] - tx[n+m])/Tout = Tin/Tout - e(k+1)/Tout = (m - e(k+1)/\text{Tin}) * Tin/Tout \quad (4)$$

The inventors have realised that the TDC 18 can be implemented to provide a measure of timing error e(k) normalized by the period Tin of the first clock signal CLK, by designing the full scale range of the TDC to be equal to the period of the first clock signal Tin. In this way, the μ[n] parameter values can be determined from the TDC measurement of e(k) and by counting the number m of rising edges of the first clock signal CLK from the current sample x[n] at time tx[n] till the next rising edge of ODR signal. For the calculation of μ the ratio Tin/Tout is also required. Based on FIG. 5, the ratio Tin/Tout is given by:

$$Tin/Tout = (m+1) + e(k)/Tin - e(k+1)/Tin \quad (5)$$

If, as it is often the case, the first clock signal CLK and the ODR signal are periodic, a more accurate value of Tin/Tout can be obtained by averaging the values obtained across multiple ODR periods.

Therefore, as the TDC 18 can be used to determine both, the timing error e and the u parameter, the DPLL 20 is only required for providing CLK2 thereby simplifying the design of the DPLL.

Alternatively, in another embodiment, the DPLL of FIG. 4 can be entirely replaced by simpler logic circuitry to provide the second clock signal CLK2 based on the resampled ODR signal or a divided-down version of the resampled ODR signal and the TDC to provide the data signal RD as described with respect to FIG. 5 above.

Figure 6:
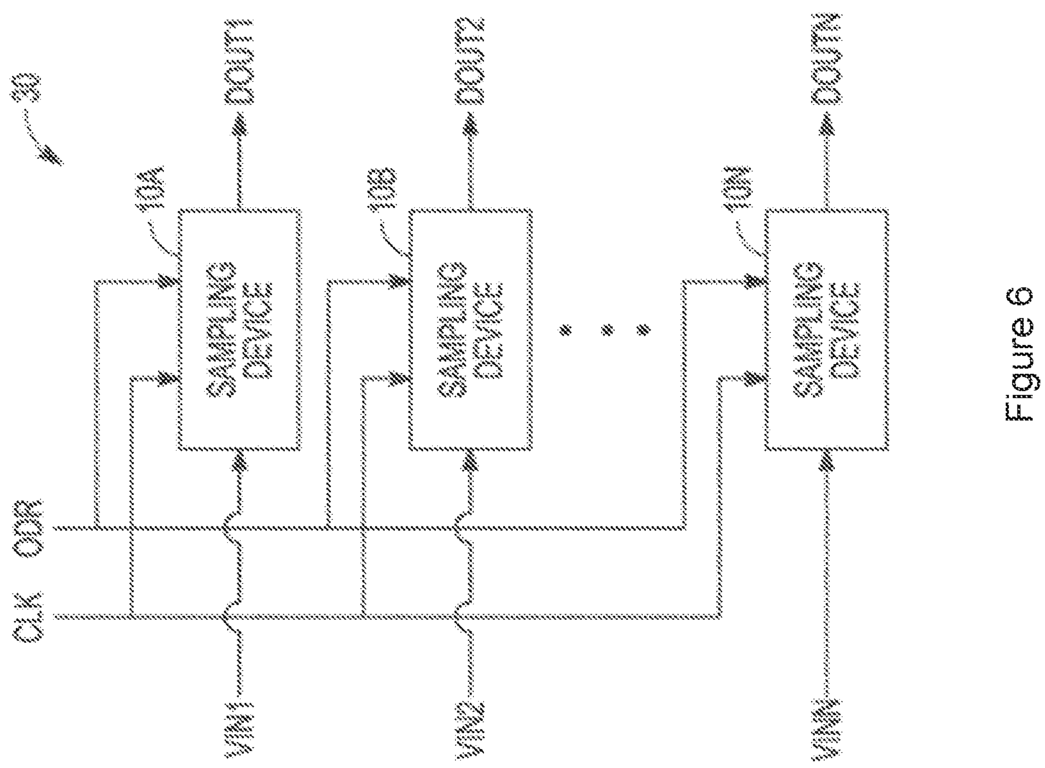
FIG. 6 shows a sampling system having a plurality of sampling devices, according to an embodiment of this disclosure.

FIG. 6 is an embodiment of a sampling and rate setting system 30 for synchronizing a plurality of sampling devices 10A-10N. At least one of the plurality of the sampling devices 10A-10N of FIG. 6 may be configured according to FIG. 1 having an improved synchronization circuit 14 with a TDC 18 as discussed above, for example with respect to FIGS. 3A, 3B and 4.

Each of the sampling devices 10 A-10 N may receive a respective analog input signal VIN 1-VINN, clock signal and output data rate signal, and provide a corresponding digital output signal DOUT 1-DOUTN. The sampling and rate setting system 30 may provide improved synchronization by eliminating the need for complex and accurate clock signal routing on a board containing the system, as the sampling devices 10 may each provide a digital output synchronized and with a rate set according to the ODR signal. It also provides improved accuracy as the synchronization circuit of at least one sampling device is configured according to FIG. 3A.

In other embodiments, the sampling devices 10 may each receive a different analog input signal and/or a different output data rate signal.

In some example configurations, the plurality of sampling devices are located on the same circuit board. The sampling circuits 12 may include sigma delta ADCs, as well as other types of ADCs, such as a successive approximation (SAR) ADC, a pipeline ADC, a flash ADC, etc., or other types of modulators. A SAR ADC interface can operate on the principle of providing a "Convert Start" signal to the analog sampling circuit directly. In sigma delta ADC, the input can be oversampled and, unlike the SAR ADC, the input signal is not sampled at the Nyquist rate but usually sampled by a large oversampling ratio. In some sigma delta ADC interfaces, the output data rate can be set via register writes and the device can generate output strobes at the requested rate along with the data. In this scenario, the sigma delta ADC device acts as a master, where the data strobes are generated by the device, as compared to the SAR ADC device, which operates as a slave.

In some embodiments, the sampling circuit 12 and rate setting circuit 16 in a sampling device 10 may together be components in an analog to digital conversion signal chain, such as a sigma delta modulator and a decimation circuit, respectively.

In other embodiments, the sample rate setting circuit 16 may set the sample rate independently of operation of the sampling circuit 12. For example, the sample rate setting circuit 16 may be a sample rate converter that may receive a first digital signal at a first sample rate and provide a second digital signal at a second sample rate.

In some embodiments, the sampling circuit 12 may be implemented as an analog circuit, while the synchronization circuit 14, rate setting circuit 16 may be implemented as one or more digital circuits.

Figure 7:
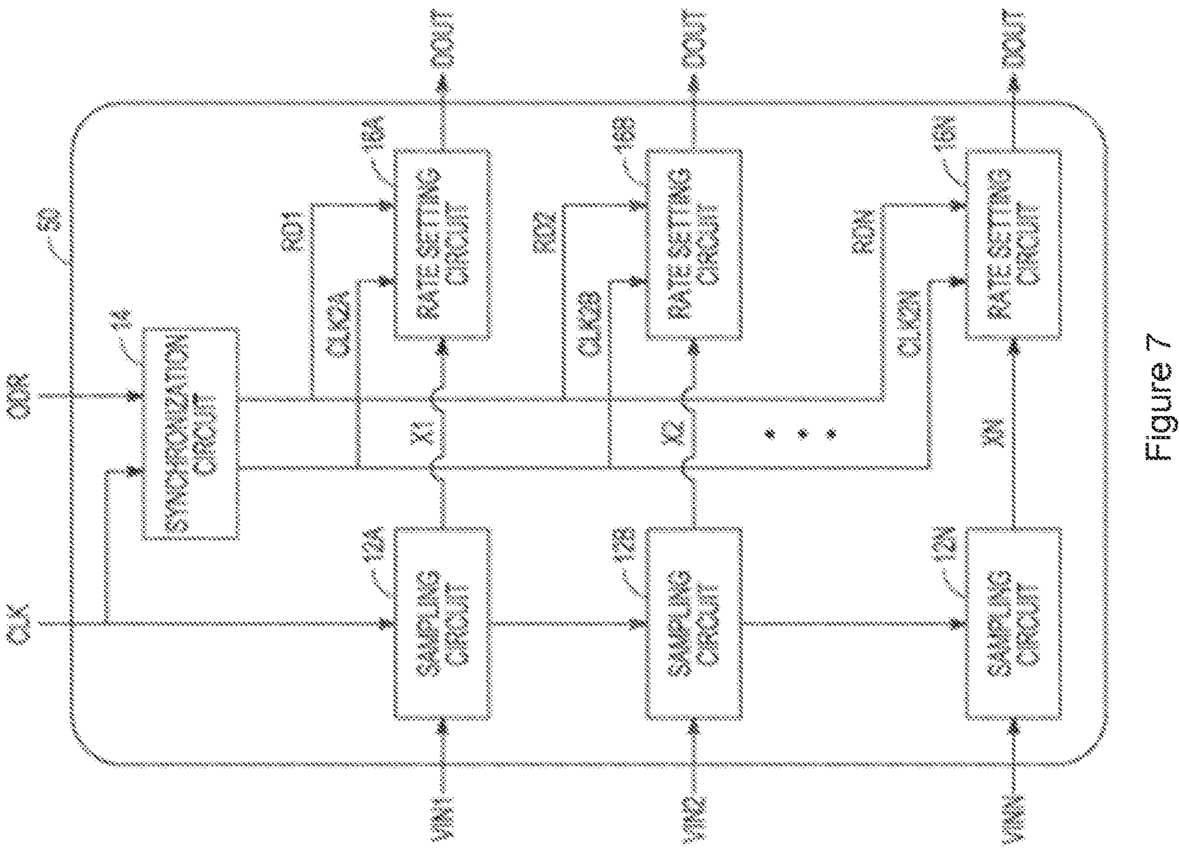
FIG. 7 depicts another embodiment of the sampling device having a plurality of sampling circuits, according to an embodiment of this disclosure.

FIG. 7 depicts another embodiment of the sampling device having a plurality of sampling channels, with an architecture based on the sampling device 10 of FIG. 1 where the synchronization circuit 14 of the sampling device is configured to operate together with a TDC as described in FIG. 3A. The sampling device 50 may include a plurality of sampling channels, shown as sampling circuits 12 A-12 N (collectively referred to as "sampling circuits 12"). In addition, the sampling device 50 may include a plurality of rate setting circuits 16 A-16 N (collectively referred to as "rate setting circuits 16") and a synchronization circuit 14 configured to operate together with a TDC (not shown) as described above, for example, with reference to FIGS. 3A, 3B and 4.

Each of the sampling circuits 12 may be paired with a corresponding rate setting circuit 16. For example, the sampling circuit 12 A may be paired with the rate setting circuit 16 A, the sampling circuit 12 B may be paired with the rate setting circuit 16 B, and so forth. Each paired combination of sampling circuit 12 and rate setting circuit 16 may be configured to operate as discussed above in regard to the embodiment of FIG. 1.

Each of the sampling circuits 12 can receive a respective input clock signal. For example, each of the sampling circuits 12 can be placed on physically different chips and therefore run on physically different clock oscillators generated a local input clock signal CLK, the frequency of which defines the sampling rate of the respective analog signal received by each of the sampling circuits 12.

The synchronization circuit 14 is configured to operate together with a TDC as discussed above, for example, in relation to FIGS. 3A, 3B and 4. The synchronization circuit 14 may provide a respective one of plurality of second clock signals CLK 2 A-CLK 2 N and ratio data signals RD 1-RDN to each of the rate setting circuits 16. For example, the synchronization circuit 14 can provide the second clock signal CLK 2 A and ratio data signal RD 1 to rate setting circuit 16 A, the second clock signal CLK 2 B and ratio data signal RD 2 to rate setting circuit 16 B, and so forth.

In some embodiments, the synchronization circuit 14 may customize the second clock signals and ratio data signals for each rate setting circuit 16 to enable the sampling device 50 to provide digital outputs DOUT at a plurality of corresponding different sampling rates. For example, the synchronization circuit 14 may be configured to provide second clock signals and ratio data signals to the plurality of rate setting circuits at a predetermined combination of different multiples of the output data rate.

In other embodiments, the synchronization circuit 14 may provide a same second clock signal and ratio data signal to a first subset or group of rate setting circuits 16 and a different second clock signal and ratio data signal to a second subset or group of rate setting circuits 16 to enable the sampling device to provide digital outputs at a mixture of the same and different sampling rates. In other words, a plurality of second clock signals can include at least first and second groups of second clock signals, where the first group of second clock signals has a different frequency than the second group of second clock signals, where the plurality of data signals includes at least first and second groups of data signals, e.g., ratio data, and where the first group of data signals is different than the second group of data signals.

Although this invention has been described in terms of certain embodiments, the embodiments can be combined to provide further embodiments. In addition, certain features shown in the context of one embodiment can be incorporated into other embodiments as well.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples

Example 1 is a time-to-digital converter (TDC) configured to receive a first signal and a second signal, the second signal being delayed compared to the first signal and having a different frequency compared to the first signal, wherein the TDC is configured to be activated between a rising edge of the first signal and a successive rising edge of the second signal and deactivated otherwise to measure a timing delay between the first signal and the second signal.

Example 2 is a TDC according to Example 1 comprising a ring oscillator wherein the TDC is configured to count a number of state transitions of the ring oscillator between the rising edge of the first signal and the successive rising edge of the second signal to measure the said timing delay between the first signal and the second signal, the ring oscillator having a higher frequency than the first signal and the second signal.

Example 3 is a TDC according to Example 1 or Example 2 wherein the second signal has a higher frequency compared to the first signal.

Example 4 is a circuit for synchronizing a sampling device to at least one other sampling device, the sampling device and the at least one sampling device receiving a first clock signal CLK and a desired output data rate signal ODR, the circuit comprising a TDC according to any of Examples 1 to 3, the TDC configured to receive the ODR signal as the first signal and the first clock signal CLK as the second signal and determine the timing delay between the ODR signal and the first clock signal, wherein an output of the TDC is coupled to a synchronization circuit, the synchronization circuit being configured to receive the determined timing delay, the ODR signal and the first clock signal CLK, and output a second clock signal CLK2 synchronized to the ODR signal.

Example 5 is a circuit according to Example 4 wherein the synchronization circuit is configured to resample the ODR signal at a rate of the first clock signal CLK and adjust a delay between the resampled ODR signal and the ODR signal based on the determined timing delay provided by the TDC.

Example 6 is a circuit according to Example 4 wherein the circuit is further configured to add an offset to the determined timing delay by the TDC and wherein the synchronization circuit is configured to receive the determined timing delay with the added offset.

Example 7 is a circuit according to Example 6 wherein the synchronization circuit is configured to resample the ODR signal at the rate of the first clock signal and adjust a delay between the resampled ODR signal and the ODR signal based on the determined timing delay with the added offset.

Example 8 is a circuit according to Example 5 wherein the synchronization circuit comprises a digital phase-locked loop DPLL, wherein the DPLL comprises a phase detector configured to receive the resampled ODR signal and the first clock signal, wherein the synchronization circuit is configured to add the determined timing delay to the output of the phase detector.

Example 9 is a circuit according to Example 6 or 7 wherein the synchronization circuit comprises a digital phase-locked loop DPLL, wherein the DPLL comprises a phase detector configured to receive the resampled ODR signal and the first clock signal, wherein the synchronization circuit is configured to add the determined timing delay with the added offset to the output of the phase detector.

Example 10 is a circuit according to any of Examples 4-9 wherein the synchronization circuit is further configured to determine a data signal indicative of a relationship between the ODR signal and the first clock signal.

Example 11 is a circuit according to Example 10, wherein the said relationship is a ratio of a frequency of the ODR signal to the frequency of the first clock signal.

Example 12 is a circuit according to any of Examples 4-9, wherein the TDC is configured to determine a data signal indicative of a relationship between the ODR signal and the first clock signal.

Example 13 is a circuit according to Example 12, wherein the full scale range of the TDC is configured to be equal to a period of the first clock signal CLK.

Example 14 is a circuit according to Example 12 or 13 wherein the TDC is further configured to provide a first count value, the first count value being a count of the number of rising edges of the first clock signal CLK between a first rising edge of the clock signal CLK used for sampling a first value of the input signal and the successive rising edge of the ODR signal and wherein the data signal is based on the determined timing delay by the TDC and the first count value.

Example 15 is a sampling device comprising: a sampling circuit configured to receive a respective analog input signal and a first clock signal and output a sampled signal based on the analog input signal at a rate based on the frequency of the first clock signal; a circuit according to any of Examples 4-13 and a rate setting circuit configured to receive a data signal indicative of the relationship between the ODR signal and the first clock signal CLK, and the second clock signal CLK 2 and output a digital signal DOUT representative of the respective analog input signal at the output data rate based on the rate of the ODR signal.

Example 16 is a sampling device according to Example 15 wherein the sampling circuit is a circuit that performs sampling as part of an analog-to-digital conversion (ADC) in an ADC circuit.

Example 17 is a sampling device according to Example 16 wherein the sampling circuit is a sigma delta modulator and the rate setting circuit is a decimation circuit.

Example 18 is a method for determining a timing error between a first signal and a second signal, the second signal being delayed compared to the first signal and having a different frequency compared to the first signal, the method comprising:

receiving, by a TDC, the first signal and a second signal, measuring, using the TDC, a timing delay between the first signal and the second signal by activating the TDC between a rising edge of the first signal a successive rising edge of the second signal and otherwise deactivating the TDC.

Example 19 is a method according to Example 18 wherein the TDC comprises a ring oscillator and measuring, using the TDC, the timing delay between the first signal and the second signal comprises counting a number of state transitions of the ring oscillator between the rising edge of the first signal and the successive rising edge of the second signal.

Example 20 is a circuit for synchronizing a sampling device to at least one other sampling device, the sampling device and the at least one sampling device receiving a first clock signal CLK and a desired output data rate signal ODR, the circuit comprising a TDC configured to receive the ODR signal as the first signal and the first clock signal as the second signal and determine the timing delay between the ODR signal and the first clock signal, wherein an output of the TDC is coupled to a synchronization circuit, the synchronization circuit being configured to receive the determined timing delay, the ODR signal and the first clock signal CLK, and output a second clock signal CLK2 synchronized to the ODR signal.

The invention claimed is:

1. A circuit including a time-to-digital converter (TDC) configured to receive a first signal and a second signal, the second signal being delayed compared to the first signal and having a different frequency compared to the first signal, wherein the TDC is configured to be activated between a rising edge of the first signal and a successive rising edge of the second signal to measure a timing delay between the first signal and the second signal and otherwise deactivated to a lower power state as compared to the activated state.

2. The circuit according to claim 1, and further comprising a ring oscillator wherein the TDC is configured to count a number of state transitions of the ring oscillator between the rising edge of the first signal and the successive rising edge of the second signal to measure the said timing delay between the first signal and the second signal, the ring oscillator having a higher frequency than the first signal and the second signal.

3. The circuit according to claim 1, wherein the second signal has a higher frequency compared to the first signal.

4. The circuit according to claim 1, comprising a synchronization circuit for synchronizing a sampling device to at least one other sampling device, the sampling device and the at least one sampling device receiving a first clock signal CLK and a desired output data rate ODR signal, the TDC configured to receive the ODR signal as the first signal and the first clock signal CLK as the second signal and to determine the timing delay between the ODR signal and the first clock signal CLK, wherein an output of the TDC is coupled to a synchronization circuit, the synchronization circuit being configured to receive the determined timing delay, the ODR signal and the first clock signal CLK, and to output a second clock signal CLK2 synchronized to the ODR signal.

5. The circuit according to claim 4 wherein the synchronization circuit is configured to resample the ODR signal at a rate of the first clock signal CLK and to adjust a delay between the resampled ODR signal and the ODR signal based on the determined timing delay provided by the TDC.

6. The circuit according to claim 4 wherein the circuit is further configured to add an offset to the determined timing delay by the TDC and wherein the synchronization circuit is configured to receive the determined timing delay with the offset added.

7. The circuit according to claim 6 wherein the synchronization circuit is configured to resample the ODR signal at the rate of the first clock signal CLK and to adjust a delay between the resampled ODR signal and the ODR signal based on the determined timing delay with the added offset.

8. The circuit according to claim 5 wherein the synchronization circuit comprises a digital phase-locked loop, DPLL, wherein the DPLL comprises a phase detector configured to receive the resampled ODR signal and the first clock signal CLK, wherein the synchronization circuit is configured to add the determined timing delay to the output of the phase detector.

9. The circuit according to claim 6 wherein the synchronization circuit comprises a digital phase-locked loop DPLL, wherein the DPLL comprises a phase detector configured to receive a resampled ODR signal and the first clock signal CLK, wherein the synchronization circuit is configured to add the determined timing delay with the added offset to the output of the phase detector.

10. The circuit according to claim 4, wherein the synchronization circuit is further configured to determine a data signal indicative of a relationship between the ODR signal and the first clock signal CLK.

11. The circuit according to claim 10, wherein the relationship is a ratio of a frequency of the ODR signal to a frequency of the first clock signal.

12. The circuit according to claim 4, wherein the TDC is configured to determine a data signal indicative of a relationship between the ODR signal and the first clock signal CLK.

13. The circuit according to claim 12, wherein a full scale range of the TDC is configured to be equal to a period of the first clock signal CLK.

14. The circuit according to claim 12 wherein the TDC is further configured to provide a first count value, the first count value being a count of a number of rising edges of the first clock signal CLK between a first rising edge of the first clock signal CLK used for sampling a first value of an input signal and the successive rising edge of the ODR signal and wherein the data signal is based on the determined timing delay by the TDC and the first count value.

15. The circuit according to claim 4, wherein the sampling device comprises:

a sampling circuit configured to receive a respective analog input signal and the first clock signal CLK and to output a sampled signal based on the respective analog input signal at a rate based on the frequency of the first clock signal CLK; and a rate setting circuit configured to receive a data signal indicative of a relationship between the ODR signal and the first clock signal CLK, and to receive the second clock signal CLK2 and to output a digital signal DOUT representative of the respective analog input signal at an output data rate based on the rate of the ODR signal.

16. The circuit according to claim 15 wherein the sampling circuit performs sampling as part of an analog-to-digital conversion (ADC) in an ADC circuit.

17. The circuit according to claim 16 wherein the sampling circuit includes a sigma delta modulator and the rate setting circuit includes a decimation circuit.

18. A method for determining a timing error between a first signal and a second signal, the second signal being delayed compared to the first signal and having a different frequency compared to the first signal, the method comprising:

receiving, by a time-to-digital converter (TDC), the first signal and a second signal; and measuring, using the TDC, a timing delay between the first signal and the second signal by activating the TDC between a rising edge of the first signal a successive rising edge of the second signal and otherwise deactivating the TDC to a lower power state as compared to the activated state.

19. The method according to claim 18 wherein the TDC comprises a ring oscillator and comprising:

measuring, using the TDC, the timing delay between the first signal and the second signal comprises counting a number of state transitions of the ring oscillator between the rising edge of the first signal and the successive rising edge of the second signal.

20. A circuit for synchronizing a sampling device to at least one other sampling device, the sampling device and the at least one sampling device receiving a first clock signal CLK and receiving a desired output data rate ODR signal, the circuit comprising a time-to-digital converter (TDC) configured to receive the ODR signal as a first signal and to receive the first clock signal CLK as a second signal and to determine a timing delay between the ODR signal and the first clock signal CLK, wherein an output of the TDC is coupled to a synchronization circuit, the synchronization circuit being configured to receive the determined timing delay, to receive the ODR signal, and to receive the first clock signal CLK, and to output a second clock signal CLK2 that is synchronized to the ODR signal.

* * * * *